US006862160B2

(12) United States Patent
Maloney et al.

(10) Patent No.: US 6,862,160 B2
(45) Date of Patent: Mar. 1, 2005

(54) APPARATUS PROVIDING ELECTRONSTATIC DISCHARGE PROTECTION HAVING CURRENT SINK TRANSISTORS AND METHOD THEREFOR

(75) Inventors: Timothy J. Maloney, Palo Alto, CA (US); Steven S. Poon, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 09/976,714

(22) Filed: Oct. 12, 2001

(65) Prior Publication Data

US 2003/0072116 A1 Apr. 17, 2003

(51) Int. Cl.[7] .................................................. H02H 9/00
(52) U.S. Cl. ........................................ 361/56; 361/111
(58) Field of Search ........................ 361/56, 91.1, 91.3, 361/111

(56) References Cited

U.S. PATENT DOCUMENTS 5,680,360 A  * 10/1997 Pilling et al. ............ 365/225.7
5,907,464 A     5/1999 Maloney et al.
5,956,219 A     9/1999 Maloney
6,008,970 A  * 12/1999 Maloney et al. .............. 361/56

OTHER PUBLICATIONS

U.S. Appl. No. 09/746,675, filed Dec. 22, 2000, Clark, et al.

U.S. App. No. 09/608,909, filed Jun. 30, 2000, Maloney et al.

T. Maloney, et al.; "Stacked PMOS Clamps for High Voltage Power Supply Protection;" Paper 2A.2, 21 st EOS/ESD Symposium, Orlando, FL; Sep. 27–30, 1999; pp. 1–8/.

T. Maloney; "Designing power supply clamps for electrostatic discharge protection of integrated circuits," Microelectronics Reliability 38 (1998); pp. 1691–1703.

* cited by examiner

Primary Examiner—Gary L. Laxton
(74) Attorney, Agent, or Firm—Kenneth M. Seddon; Lanny L. Parker

(57) ABSTRACT

An electrostatic discharge circuit may include an RC timer that may be used to control the operation of two or more tiers within the ESD circuit.

10 Claims, 5 Drawing Sheets

US 6,862,160 B2

APPARATUS PROVIDING ELECTRONSTATIC DISCHARGE PROTECTION HAVING CURRENT SINK TRANSISTORS AND METHOD THEREFOR

BACKGROUND

Integrated circuits (ICs) are typically manufactured with external connections for receiving either power supply voltages, control or communication signals with external devices or systems. The trend in fabricating ICs is to increase the density of internal components, such as transistors and interconnects. In addition, the power supply potential used to operate the integrated circuits continues to decrease.

As integrated circuit devices increase in density and operating supply voltages decrease, the integrated circuits become more sensitive to the effects of electrostatic discharge. Electrostatic discharge (ESD) refers to the phenomenon of electrical discharge of high current for a short time duration resulting from a build up of static charge on a particular integrated circuit package, or on a nearby human handling that particular IC package. ESD is a serious problem for semiconductor devices since it has the potential to destroy an entire IC. Because ESD events occur often across the silicon circuits attached to IC package terminals, circuit designers have concentrated their efforts on developing adequate protection mechanisms for these sensitive circuits.

One solution is the use of a grounded gate transistor as a simple ESD protection circuit. The transistor is configured as a diode and has a drain junction breakdown voltage lower than the gate dielectric breakdown voltage. While this circuit provides some protection from ESD events, an ESD protection circuit should be able to protect an IC against static discharge by non-destructively passing large currents through a low impedance path in a short time.

As power supply voltages scale down (e.g., from 5.0 volts, to 3.3 volts, to 2.5, 1.8, 1.3 volts and below), backward compatibility with the higher voltage requirements of older ICs may be desirable. Accordingly, an electrostatic discharge (ESD) clamp circuit employing stacked p-type metal oxide semiconductor (PMOS) transistors may be used. The high voltage clamp may have series coupled transistors which form a switchable conductive circuit between a high voltage supply and ground. These transistors may be turned off during non-ESD events, but activated during an ESD event to provide a discharge path for an ESD current. However, the gates of these discharge transistors may not be driven fully to ground, and thus, the transistors may not dissipate the maximum possible current from the supply node.

For the reasons stated above, there is a need in the art for a circuit which increases the efficiency of ESD power supply clamping circuitry to sink larger currents during an ESD event, while maintaining backward compatibility with the higher voltage requirements of older ICs.

BRIEF DESCRIPTION OF THE DRAWINGS

The subject matter regarded as the invention is particularly pointed out end distinctly claimed in the concluding portion of the specification. The invention, however, both as to organization and method of operation, together with objects, features, and advantages thereof, may best be understood by reference to the following detailed description when read with the accompanying drawings in which:

Figure 1:
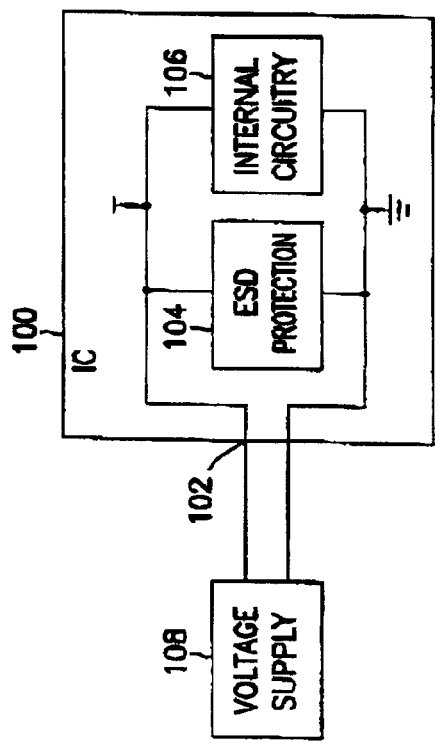
FIG. 1 is a block diagram of an integrated circuit according to an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Although the scope of the present invention is not limited in this respect, a particular embodiment of the present invention provides clamping circuitry for use in electrostatic discharge where PMOS discharge transistors are provided for sinking large currents to improve protection during ESD events. FIG. 1 is a block diagram of an integrated circuit 100 which has a voltage supply input connection 102 for receiving an externally provided high supply voltage from supply circuit 108, although the scope of the present invention is not limited in this respect. An ESD protection circuit 104 may protect internal circuitry 106 from electrostatic discharge. The protection circuitry is described in detail below. The integrated circuit 100 can be any type of integrated circuit that receives a supply voltage, including, but not limited to, processors, controllers, memory devices, and application specific integrated circuits (ASIC). In additional it should be understood that the integrated circuit 100 may be combined with other integrated circuits such as, for example, static random access memories, to provide systems offering greater functionality.

Figure 2:
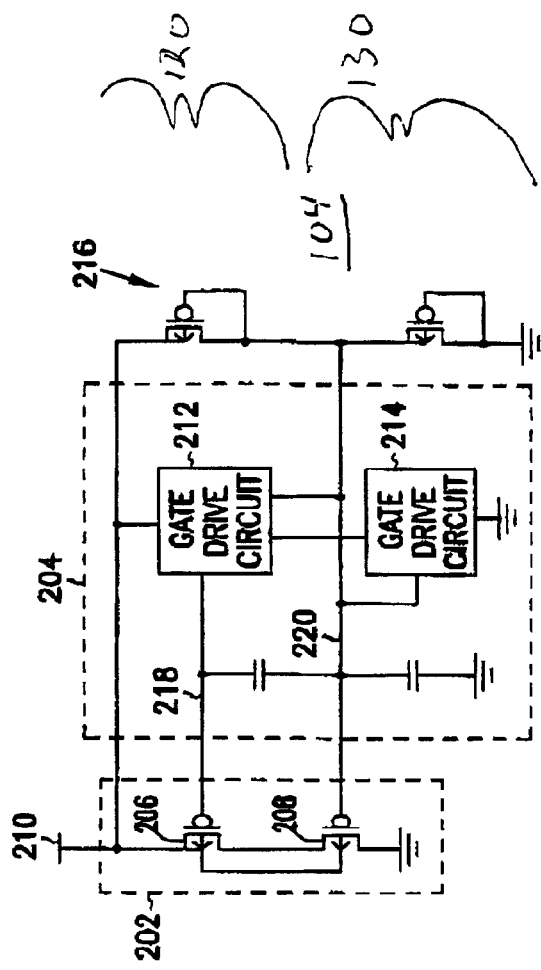
FIG. 2 is a clamp circuit having a stacked-gate PMOS transistor.

Turning now to FIG. 2, an example of ESD protection circuit 104 is provided. Although the scope of the present invention is not limited in this respect, as supply voltages scale down, backward compatibility with the higher voltage requirements of older ICs may become important, and ESD protection circuit 104 may be applicable where supply voltages are too high to be dropped across one thin gate oxide.

ESD protection circuit 104 may include a switchable current sinking circuit 202 enabled or driven low by control circuit 204. Switchable current sinking circuit 202 may include series coupled transistors 206 and 208 which form a conductive circuit between node 210 and ground, although the scope of the present invention is not limited in this respect. Transistors 206 and 208 may be switched on to conduct current (i.e. during an ESD event), or, one or both may be switched off so that substantially no current flows (i.e. during normal operation of integrated circuit 100). Transistors 206 and 208 may be fabricated in the same n-well to eliminate a need for contacts at their common node. However, in alterative embodiments, transistors 206 and 208 may be formed in separate or different wells.

The circuit of FIG. 2 includes a voltage divider circuit 216 that reduces the high supply voltage on node 210 to a smaller voltage on node 220 that may be more appropriate for long-term exposure on a single transistor gate oxide. Gate drive circuits 212 and 214 are provided to couple the transistor gate connections 218 and 220 to substrate ground. Drive circuits 212 and 214, therefore, may turn on transistors 206 and 208 hard.

Figure 6:
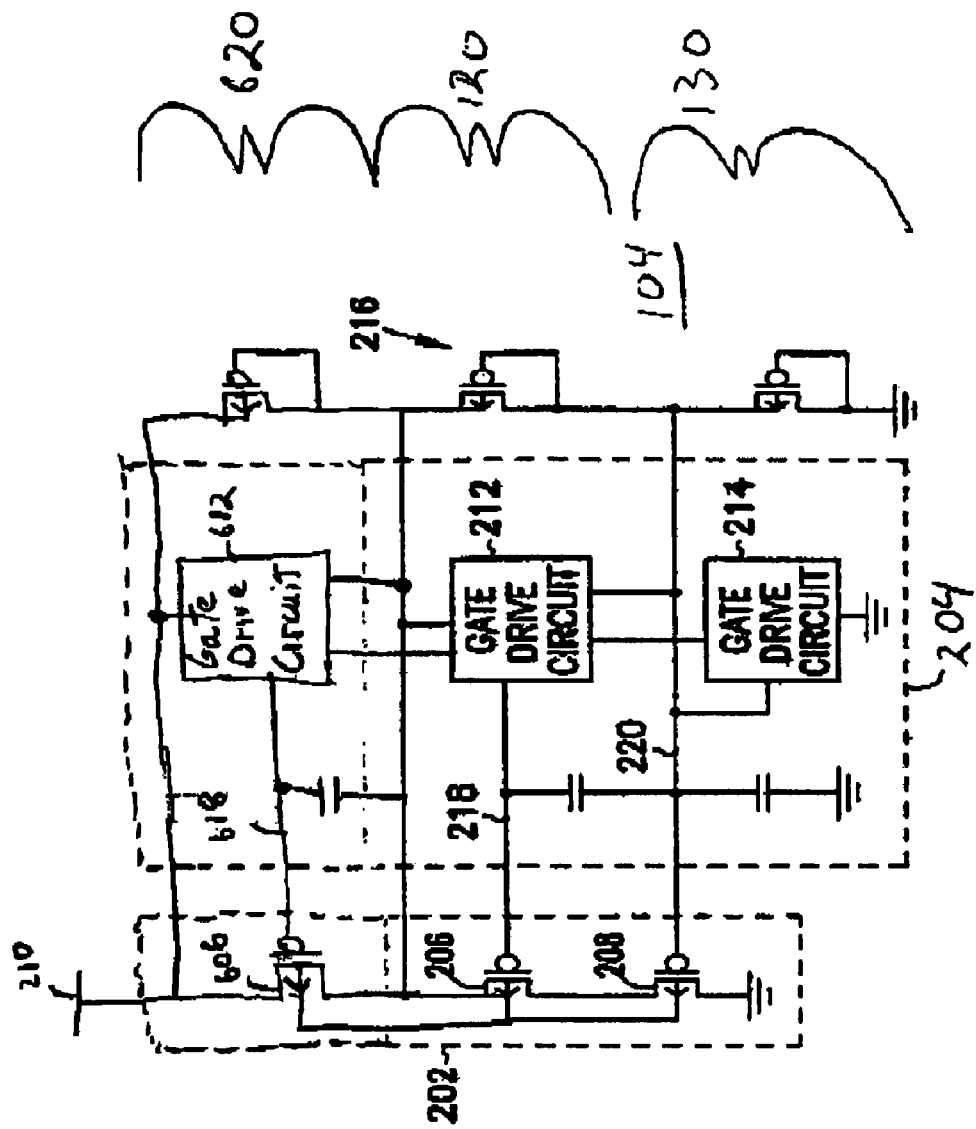
FIG. 6 is a clamp circuit having three tiers in accordance with another embodiment of the present invention.

Although the scope of the present invention is not limited in this respect, ESD protection circuit 104 may comprise two or more tiers, such as the two tiers 120 and 130 as shown in FIG. 2. The tiers 120 and 130 may include one of the transistors of current sinking circuit 202, one of gate drive circuits 212 and 214, and one of transistors of voltage divider circuit 216. In other words, tiers 120 and 130 may represent the logic associated with one or more transistors in a current sinking circuit or with one or more transistors in a voltage divider circuit in the ESD protection circuit. It should also be understood that although only two tiers are shown in FIG. 2, alternative embodiments of the present invention may have three or more tiers as desired. For example, FIG. 6 illustrates an embodiment having a third tier 630 and a current sinking transistor 606.

Figure 3:
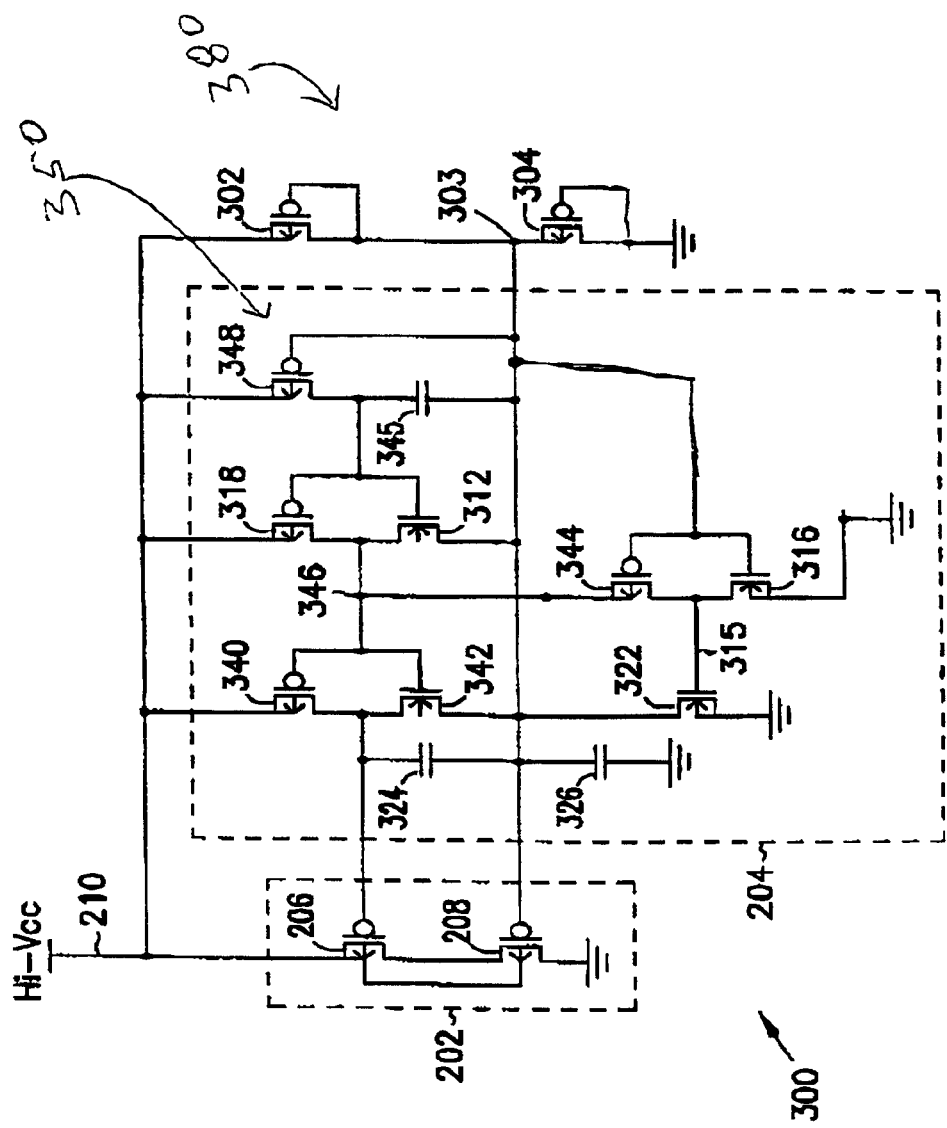
FIG. 3 is a clamp circuit having a stacked-gate PMOS transistor.

Referring now to FIG. 3, one embodiment of a PMOS clamp circuit 300 for use in high voltage tolerant circuits is illustrated. The clamp circuit includes a switchable current sinking circuit 202 that may be driven low by control circuit 204. A voltage divider circuit 380 of the clamp has a p-channel field effect transistor (PFET) 302 coupled between power supply node 210 and intermediate node 303. Another PFET 304 is coupled between node 303 and ground. PFETs 302 and 304 divide the high voltage from node 210 into a smaller voltage on node 303 which may be more appropriate for long-term exposure on a single transistor gate oxide.

Series coupled transistors 206 and 208 may provide a switchable conductive circuit between nodes 210 and ground. Transistors 206 and 208 may be switched on to conduct current, or, one (usually 206) or both may be switched off so that substantially no current flows. Those skilled in the art will recognize that some very small current may flow due to leakage or sub-threshold conduction mechanisms, but the transistors are still considered to be off.

To achieve a steady state low leakage current, only one or both of transistors 206 and 208 may be turned off. For example, transistor 206, electrically adjacent to power supply node 210, may be turned off to achieve the steady state low leakage current. This may be accomplished when the gate of transistor 206 is pulled up to substantially the voltage potential of power supply node 210, through PFET 340. This may happen when transistor 312 is activated as RC timer 350 (e.g. capacitor 345 and transistor 348) stabilizes, as explained below.

One embodiment of drive circuit 214 (see FIG. 2) may include transistors 316, 322 and 344. Transistors 344 and 316 are coupled to form a first inverter circuit with an input terminal connected to received an intermediate voltage potential provided by voltage divider 380 (e.g. the voltage potential on node 303). During an ESD event, the transistor 322 is enabled to pull node 303 to ground, and thus, activate current sink transistor 208.

One embodiment of drive circuit 212 (see FIG. 2) includes transistors 312, 318, 340, 342 and 348, and capacitor 345. An RC timer circuit 350 is formed by transistor 348 and capacitor 345. Transistors 312 and 318 form an inverter coupled in series with another inverter formed by transistors 340 and 342. It is noted that transistor 344 is connected to node 346, which is common with the two series inverters. Node 346 is used to couple a high pulsed voltage to the gates of transistors 342 and 322 to pull down the gates of transistors 206 and 208.

During non-ESD event operations, transistor 348 is activated by the voltage on node 303 to both charge capacitor 345 and activate transistor 312. Transistor 340 is then turned on to couple the gate of transistor 206 high. Because node 346 is pulled low to the mid-voltage of node 303, transistor 340 also charges capacitor 324. Likewise, capacitor 326 is charged to the intermediate voltage of node 303. Transistors 206 and 208 are, therefore, turned off during non-ESD operations.

During an ESD event, the voltage on node 210 is pulled higher, and NFETs 322 and 342 pull the voltages on the gates of PFETs 206 and 208 to ground so that the double gate FET is turned on hard during an ESD pulse. That is, in response to an increase in the voltage on node 210, RC timer circuit 350 keeps the gate voltage on transistor 318 sufficient to activate transistor 318 and couple node 346 to node 210. As a result, the gate connection of transistor 342 is pulled sufficiently high (close to node 210) to fully couple the gate of transistor 206 to node 303, without a Vt drop through transistor 342.

With the gate voltage of transistor 344 held substantially constant by RC timer 350, transistor 344 is activated when node 346 is pulled high and the voltage potential on node 303 is relatively low. Thus, the elevated voltage on node 346 pulls the gate 315 of transistor 322 to a high voltage (node 346) through transistor 344 and 318. As a result, the gate voltage of transistor 322 is pulled sufficiently high to fully couple node 303 to ground, without a threshold voltage (Vt) drop through transistor 322. The stacked-gate PMOS clamp circuit 300, therefore, couples the gates of discharge transistors 206 and 208 to substrate ground during an ESD event. With the gates of transistors 206 and 208 fully coupled to ground, the ESD discharge path through transistors 206 and 208 may sink relatively large currents. Over a longer time period, RC timer circuit 350 may charge capacitor 345 to flip the inverter circuits and turn off transistors 206.

The amount of current that may be discharged through transistors 206 and 208 may depend on the size of transistors 206 and 208. For example, transistors 206 and 208 may have a width of at least 500 microns and a channel length of less than about 0.2 microns, although the scope of the present invention is not limited in this respect. It should be understood the physical and electrical characteristics of transistors 206 and 208 may be altered so that transistors 206 and 208 are capable of carrying a desired amount of pulsed current. In this particular embodiment, transistors 206 and 208 may be able to conduct at least 1 amp or more depending on factors such as its width. In alternative embodiments, transistors 206 and 208 may be capable of conducting a pulsed 5–10 amps without any adverse effects.

As explained earlier, alternative embodiments of the present invention may include three or more tiers within ESD protection circuit 104. In such optional embodiments, the gate drive circuits of the subsequent additional tiers may also include an inverter whose input terminal is coupled to the corresponding intermediate voltage potential provided by the voltage divider.

Figure 4:
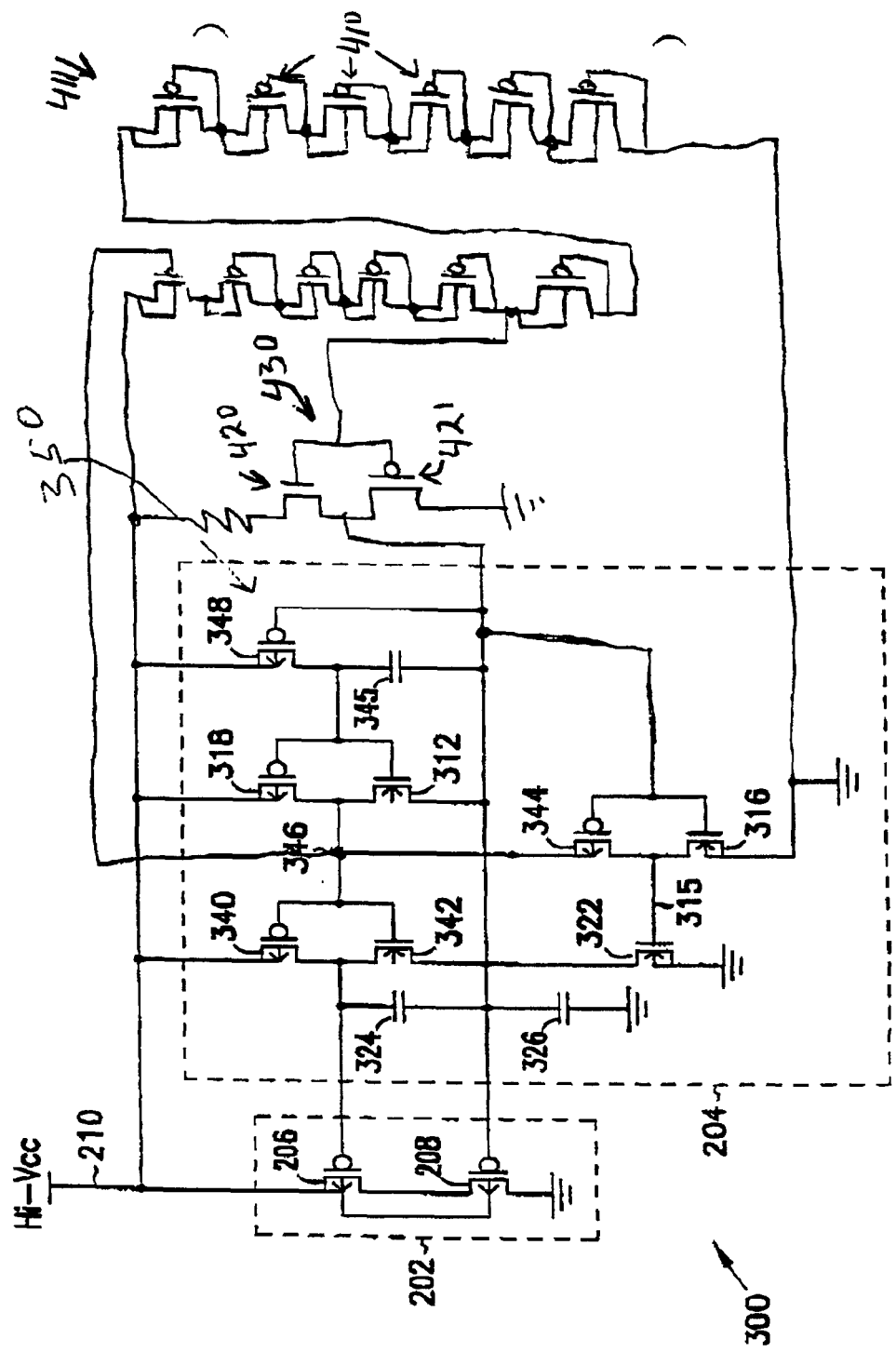
FIG. 4 is an alternate embodiment of the present invention.

Referring to FIG. 4, an alternate embodiment of a PMOS clamp circuit is illustrated. As shown in FIG. 4, a plurality of transistors 410 may be used to provide a voltage divider 411. Voltage divider 411 may be used to provide an output voltage potential that is a fraction of the power supply voltage potential, Vcc (e.g. the voltage potential on node 210). The output voltage potential may be provided to a voltage buffer 430. Voltage buffer 430 may be provided with transistors 420–421 and may be used to amplify or drive a voltage potential to the gate terminal of RC timer 350. The use of transistors 410 may be desirable to step down the voltage potential associated with an ESD event. Although the scope of the present invention is not limited in this respect, it may be desirable to manufacture transistors 410 so that they are of about the same size (i.e. similar channel lengths, etc.).

Figure 5:
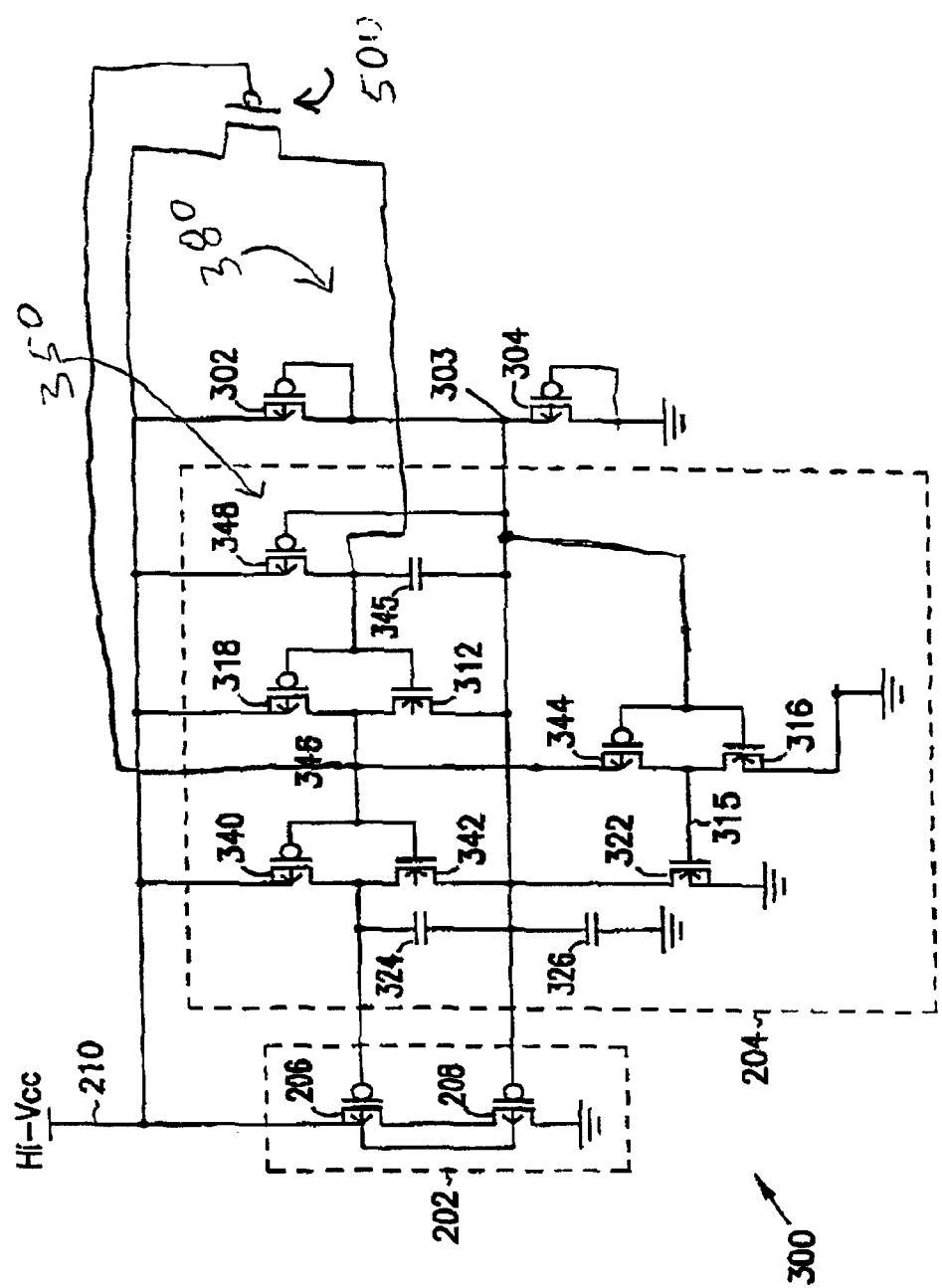
FIG. 5 is an alternate ESD circuit in accordance with an alternate embodiment of the present invention.

Turning now to FIG. 5, yet another alternative embodiment of the present invention is provided. As shown, a latch 500 may be added so that it is coupled to RC timer 350. Latch 500 may be desirable for proper operation of RC timer 350 even when there is no ESD event, on account of gate oxide leakage in advanced processes.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus having an electrostatic discharge (ESD) device, the ESD device comprising:
    a voltage divider to provide a first intermediate voltage potential;
    a first current sink transistor;
    a second current sink transistor coupled in series with the first current sink transistor and having a gate to receive the first intermediate voltage potential and a current carrying electrode to receive a ground voltage potential; and
    a drive circuit to limit the first intermediate voltage potential to the gate of the second current sink transistor, wherein the drive circuit comprises an inverter with an input to receive the first intermediate voltage potential.

2. The apparatus of claim 1, wherein the first current sink transistor and the second current sink transistor are p-channel transistors.

3. The apparatus of claim 2, wherein the first current sink transistor and the second current sink transistor are formed in a same well in a semiconductor substrate.

4. The apparatus of claim 2, wherein the first current sink transistor and the second current sink transistor are formed in different wells in a semiconductor substrate.

5. An apparatus comprising:
    a static random access memory; and
    an integrated circuit, the integrated circuit having an electrostatic protection circuit comprising:
        first and second transistors connected in series between a positive voltage supply and a ground potential, where a gate of the second transistor receives an intermediate voltage potential;
        an RC timer to receive the intermediate voltage potential and generate a signal coupled to a gate of the first transistor; and
        a drive circuit that includes an inverter to receive the intermediate voltage potential, where the inverter drives a pull down transistor to limit the intermediate voltage potential supplied to the gate of the second transistor.

6. The apparatus of claim 5, further comprising a voltage divider to provide the intermediate voltage potential.

7. The apparatus of claim 5, wherein the RC timer includes a p-channel transistor and a capacitor.

8. The apparatus of claim 7, wherein the capacitor is connected to the input terminal of the inverter and is adapted to receive the intermediate voltage potential.

9. The apparatus of claim 5, wherein the voltage divider comprises at least four transistors coupled in series.

10. The apparatus of claim 5, wherein the voltage divider comprises at least two transistors coupled in genes between voltage potential rails.

* * * * *

UNITED STATES PATENT AND TRADEMARK OFFICE
CERTIFICATE OF CORRECTION

PATENT NO.   : 6,862,160 B2
DATED        : March 1, 2005
INVENTOR(S)  : Maloney et al.

It is certified that error appears in the above-identified patent and that said Letters Patent is hereby corrected as shown below:

Column 1,
Line 60, delete "end" and insert -- and --.

Column 6,
Line 50, delete "genes" and insert -- series --.

Signed and Sealed this

Twenty-fourth Day of May, 2005

JON W. DUDAS
*Director of the United States Patent and Trademark Office*